US012575022B2

(12) United States Patent
Halimi et al.

(10) Patent No.: US 12,575,022 B2
(45) Date of Patent: Mar. 10, 2026

(54) SYSTEMS AND METHODS FOR IMPROVING HIGH FREQUENCY TRANSMISSION IN PRINTED CIRCUIT BOARDS

(71) Applicant: VAYYAR IMAGING LTD., Yehud (IL)

(72) Inventors: Rohi Halimi, Shokeda (IL); Itsik Refaeli, Modiin (IL); Miroslav Baryakh, Rosh HaAyin (IL)

( * ) Notice: Subject to any disclaimer, the term of this patent is extended or adjusted under 35 U.S.C. 154(b) by 255 days.

(21) Appl. No.: 18/265,438

(22) PCT Filed: Jan. 18, 2022

(86) PCT No.: PCT/IB2022/050372
§ 371 (c)(1),
(2) Date: Jun. 6, 2023

(87) PCT Pub. No.: WO2022/153275
PCT Pub. Date: Jul. 21, 2022

(65) Prior Publication Data
US 2024/0121888 A1     Apr. 11, 2024

Related U.S. Application Data

(60) Provisional application No. 63/138,564, filed on Jan. 18, 2021.

(51) Int. Cl.
*H05K 1/02*     (2006.01)
*H05K 3/42*     (2006.01)
*H05K 3/46*     (2006.01)

(52) U.S. Cl.
CPC ........... *H05K 1/0242* (2013.01); *H05K 3/429* (2013.01); *H05K 3/4611* (2013.01); *H05K 2203/061* (2013.01)

(58) Field of Classification Search
None
See application file for complete search history.

(56) References Cited

U.S. PATENT DOCUMENTS

| | | | | |
|---|---|---|---|---|
| 5,718,789 | A * | 2/1998 | Gebhardt | H05K 3/045 |
| | | | | 156/154 |
| 5,861,076 | A * | 1/1999 | Adlam | H05K 3/385 |
| | | | | 427/98.8 |
| 2006/0121722 | A1* | 6/2006 | Card | H05K 3/429 |
| | | | | 174/250 |
| 2009/0064497 | A1 | 3/2009 | Mok et al. | |
| 2012/0125680 | A1 | 5/2012 | Hirose et al. | |
| 2017/0054205 | A1 | 2/2017 | Feldman et al. | |
| 2017/0250466 | A1 | 8/2017 | Schlaffer | |
| 2018/0332721 | A1 | 11/2018 | Shimizu et al. | |

FOREIGN PATENT DOCUMENTS

| | | | |
|---|---|---|---|
| CN | 102014590 B | * | 7/2012 |
| TW | 1337059 B | * | 2/2011 |

* cited by examiner

*Primary Examiner* — Michael B Cleveland
(74) *Attorney, Agent, or Firm* — AlphaPatent Associates Ltd.; Daniel J. Swirsky

(57) ABSTRACT

Systems and methods for improving high frequency transmission in printed circuit boards use the smooth internal interfaces between the conducting laminate and dielectric substrates of PCB cores to serve as signal carrying lines and ground planes in transmission lines. Flanking PCB cores may be mounted to a central dielectric layer including a stripped PCB core providing structural integrity of the PCB.

8 Claims, 4 Drawing Sheets

200

PROVIDE CENTRAL PCB CORE — 201

REMOVE ALL CONDUCTING LAMINATE FROM CENTRAL PCB CORE — 202

APPLY PREPREG TO UPPER AND LOWER CORE SURFACES — 203

ADHERE FLANKING PCB CORES TO THE CENTRAL CORE — 204

300

SYSTEMS AND METHODS FOR IMPROVING HIGH FREQUENCY TRANSMISSION IN PRINTED CIRCUIT BOARDS

CROSS-REFERENCE TO RELATED APPLICATIONS

This application is a U.S. National Phase Application under 35 U.S.C. 371 of International Application No. PCT/IB2022/050372, which has an international filing date of Jan. 18, 2022, and which claims the benefit of priority from U.S. Provisional Patent Application No. 63/138,564, filed Jan. 18, 2021, the contents of which are incorporated by reference in their entirety.

FIELD OF THE DISCLOSURE

The disclosure herein relates to systems and methods for improving transmission of high frequency signals in printed circuit boards (PCBs). In particular, the disclosure relates to PCB stacks with reduced conductor surface roughness and corresponding circuits with reduced high frequency signal losses.

BACKGROUND

High frequency circuits experience transmission line and resonator losses arising from both dielectric material properties, as well as from metal layer properties, in particular from surface roughness.

At high frequencies, one of the most dominant contributions to the transmission line loss is conductor surface roughness. The surface resistivity of metals at high frequency is dominated by the "skin effect", meaning that the currents flow on outermost layer of the metal only. The thickness of the current carrying layer $\delta$ is inversely-proportional to the square-root of frequency f as given by the formula:

$$\delta \approx \sqrt{\frac{\rho}{\mu f}}$$

where $\rho$ is the resistivity and $\mu$ is the permeability of the conductor.

Accordingly, at millimeter-wave frequencies the skin thickness in copper is only a fraction of a micron. At such low thickness, the conductive path length is highly dependent upon the roughness of the surface. When the surface of the metal is rough it has an uneven structure which elongates the path of the current. and causes an increase in resistance of the conductor. Surface resistivity translates proportionately to losses per unit length of a transmission line. In particular, microstrip transmission lines have a signal carrying line, and a groundplane; stripline transmission lines have a signal carrying line surrounded by two groundplanes. The resistivity of both the current carrying line and of the groundplanes has an effect on the transmission line losses.

Typical methods for manufacturing PCB stacks result in increased roughness of the conducting layers because, in order to improve adhesion between conducting and dielectric layers, the conducting layers are deliberately abraded. At low frequency the rough surfaces of the conductors do not significantly effect the quality of signal transmission however at high frequencies this may result in unacceptable losses.

Reference is now made to FIG. 1, which is a cross section schematically representing a typical PCB stack of the prior art. The PCB consists of alternate conducting layers 130a-f, and dielectric layers 110, 120a-d. Various vias 140a-c are used to connect conducting layers as required.

By way of example a stripline transmission line may consist of a signal layer 130b sandwiched between two ground references 130a, 130c and separated therefrom by intermediate dielectric layers 120a, 120b.

A central PCB core layer 110 consists of an off-the-shelf sheet of rigid dielectric material laminated on its upper and lower surfaces with copper conductors 130c, 130d. Because the copper laminate 130c, 130d is attached to the rigid dielectric by the supplier, the interfacing surfaces 111, 112 between the copper and the dielectric are not roughened during the manufacture of the PCB. Furthermore, the rigid dielectric material of the core 110 remains stiff throughout the stacking process.

Further dielectric layers 120a-d may be added by adhering a softer pre-impregnated composite material, or prepreg, to the conductors 130a-f. In order to achieve good adhesion between the conductor and the prepreg, the outer surface of the copper laminate 130c, 130d of the core is typically abraded before the prepreg is applied. Similarly, rough copper foil is used for the additional conducting layers 130a, 130b, 130c, 130d. This ensures good adhesion between the adjacent prepreg layers and conducting layer when pressure and heat are applied during PCB manufacture. Although this achieves structurally sound PCB stacks, such roughness results in higher surface resistivity.

Accordingly, in stripline transmission when a high frequency Radio Frequency (RF) signal is routed through the signal layer 130b, 130e, the rough surfaces of the signal line conductors result in inconsistent losses and poor transmission efficiency.

Thus, the need remains for systems and methods for improving transmission of high frequency signals in PCBs. The invention described herein addresses the above-described needs.

SUMMARY OF THE EMBODIMENTS

According to one aspect of the presently disclosed subject matter, a method is hereby taught for manufacturing a printed circuit board (PCB) having improved high frequency transmission. The method includes providing a PCB core comprising a central core comprising a rigid base material void of conductor lamination and adhering an upper inner prepreg layer to an upper side surface of the central core and a lower inner prepreg layer to a lower surface of the central core.

Optionally, the step of providing the central core void of conductor lamination comprises: providing a first PCB core comprising a conductor laminated rigid base material; and removing all conducting laminate from the first PCB core leaving only a substrate of rigid base dielectric material.

An upper flanking PCB core and a lower flanking PCB core are provided and adhered to the upper inner prepreg layer and the lower inner prepreg layer. An upper outer prepreg layer is adhered to the upper flanking PCB core and a lower outer prepreg layer is adhered to the lower flanking PCB core. A conductive layer is adhered to each of the upper outer prepreg layer and the lower outer prepreg layer, and a solder mask is applied.

Optionally, the outer conducting layer may comprise a copper sheet layer, and the step of adhering each outer conducing layer to an outer prepreg layer comprises providing the copper sheet layer; abrading an inner surface of the copper sheet layer; abutting an abraded surface of the copper sheet layer to the outer prepreg layer; and pressing the copper sheet layer to the outer prepreg layer.

Alternatively, the outer conducting layer may comprise an outer PCB core layer, and the step of adhering each outer conducing layer to an outer prepreg layer comprises: providing the outer PCB core layer comprising a rigid base material laminated by an outer conducting surface and an inner conducting surface, removing all conducting material from the inner conducting surface of the outer PCB core thereby creating an inner dielectric surface, abutting the inner dielectric surface to the outer prepreg layer; and pressing the outer PCB core layer to the outer prepreg layer.

Where appropriate, the step of adhering a conducing layer to a prepreg layer comprises: abrading at least one surface of the conducting layer; abutting an abraded surface of the conducting layer to the prepreg layer; and pressing the conducting layer to the prepreg layer.

Optionally, the method further comprises preparing at least one via by drilling a hole through at least one layer; and conductively plating the inner surface of the hole. For example the method may include preparing a via through the upper flanking PCB core conductively connecting the outer conducting surface of the upper flanking PCB core to the inner conducting surface of the upper flanking PCB core; preparing a via through the lower flanking PCB core conductively connecting the outer conducting surface of the lower flanking PCB core to the inner conducting surface of the lower flanking PCB core; and preparing a bridging via conductively connecting the outer conducting surface of the upper flanking PCB core to the inner conducting surface of the lower flanking PCB core.

Additionally or alternatively, the method may include: preparing a via through the upper outer conducting layer and the upper outer prepreg layer conductively connecting the upper outer conducting layer to the outer conducting surface of the upper flanking PCB core; preparing a via through the lower outer conducting layer and the lower outer prepreg layer conductively connecting the lower outer conducting layer to the outer conducting surface of the lower flanking PCB core; and preparing a through via conductively connecting the upper outer conducting layer to the lower outer conducting layer. Optionally, the step of preparing the through via conductively connecting the upper outer conducting layer to the lower outer conducting layer may comprise drilling a through hole from the upper outer conducting layer to the lower outer conducting layer; conductively plating the inner surface of the through hole; and filling the through hole with resin.

According to another aspect, a system is introduced for improving high frequency transmission in printed circuit boards comprising at least one planar transmission line in which a signal carrying layer is sandwiched between an inner ground plane layer and an outer ground plane layer, and the signal carrying layer is separated from the outer ground plane layer by a first dielectric substrate, and the signal carrying layer is separated from the inner ground plane layer by a second dielectric substrate. The system is characterized by the first dielectric substrate comprising a rigid base material of a PCB core, the signal carrying layer comprises a first copper laminate surface of the PCB core, and the inner ground plane comprises a second copper laminate surface of the PCB core.

Optionally, the second dielectric substrate comprises a prepreg insulator layer, and the second signal ground plane comprises a copper foil. Alternatively, the second dielectric substrate may comprise a prepreg insulator layer and a rigid base material of a second PCB core, and the second signal ground plane comprises a copper laminate surface of the PCB core.

Where appropriate, the first signal ground plane is adhered to a rigid core via a prepreg insulator.

Additionally or alternatively, the system may be a double-sided printed circuit board comprising: a rigid central core substrate; a first planar transmission line adhered to a first side of the rigid central core substrate via a prepreg insulator; and a second planar transmission line adhered to a first side of the rigid central core substrate via a prepreg insulator. In some examples the rigid central core substrate comprises a PCB core from which a copper laminate surface has been removed.

Optionally, the system includes a first via structure connecting the outer ground plane of the first planar transmission line to the outer ground plane of the second planar transmission line; a second via structure connecting the outer ground plane of the first planar transmission line to the inner ground plane of the first planar transmission line; and a third via structure connecting the outer ground plane of the second planar transmission line to the inner ground plane of the second planar transmission line. The inner ground plane layer may comprise a smooth and unplated copper laminate surface of the PCT core.

According to still another aspect, a method is taught for manufacturing a high frequency planar transmission line on a printed circuit board comprising: providing a PCB core comprising a rigid base material, a first conductive laminated surface and a second conductive laminated surface; applying a prepreg layer to the first conductive laminated surface of the PCB core; adhering a conducting layer to the prepreg layer; applying a solder mask; and routing a signal through the conductive laminate of the first side surface of the PCB core. Optionally, the method further includes preparing a via conductively connecting the conductive layer to the second conductive laminated surface of the PCB core.

Where appropriate, the conducting layer may comprise a copper sheet layer, and the step of adhering the conducing layer to the prepreg layer comprises: providing the copper sheet layer; abrading an inner surface of the copper sheet layer; abutting an abraded surface of the copper sheet layer to the outer prepreg layer; and pressing the copper sheet layer to the outer prepreg layer.

Alternatively, where the outer conducting layer comprises a second PCB core layer, the step of adhering the conducing layer to the prepreg layer may comprise: providing the second PCB core layer comprising a rigid base dielectric material laminated by a first conducting surface and a second conducting surface; removing all conducting material from the first conducting surface; abutting the rigid base dielectric material substrate of the second PCB core surface to the prepreg layer; and pressing the second PCB core layer to the prepreg layer.

BRIEF DESCRIPTION OF THE FIGURES

For a better understanding of the embodiments and to show how it may be carried into effect, reference will now be made, purely by way of example, to the accompanying drawings.

With specific reference now to the drawings in detail, it is stressed that the particulars shown are by way of example and for purposes of illustrative discussion of selected embodiments only, and are presented in the cause of providing what is believed to be the most useful and readily understood description of the principles and conceptual aspects. In this regard, no attempt is made to show structural details in more detail than is necessary for a fundamental understanding; the description taken with the drawings making apparent to those skilled in the art how the various selected embodiments may be put into practice. In the accompanying drawings.

DETAILED DESCRIPTION

Figure 1:
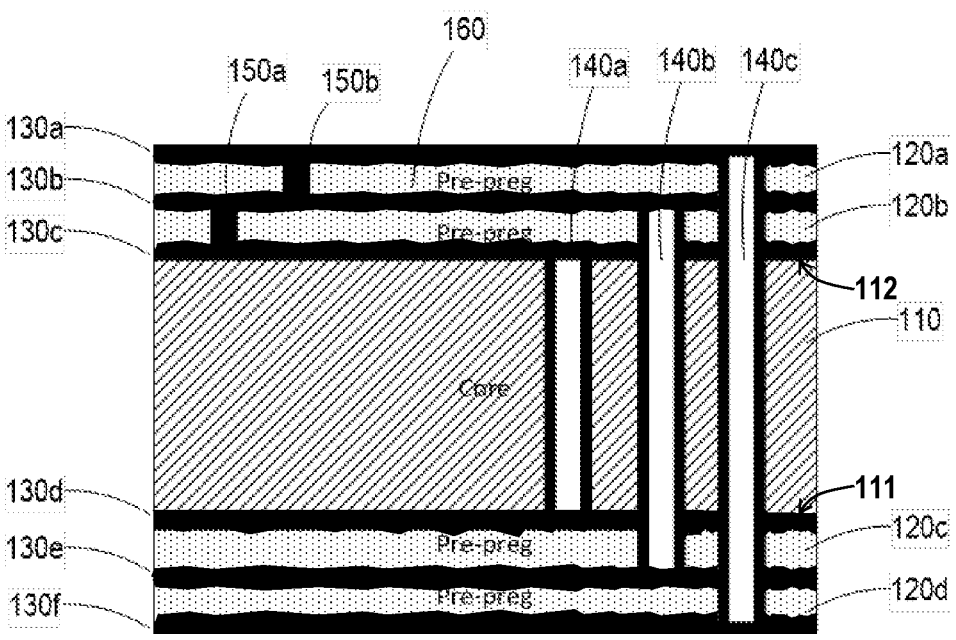
FIG. 1 is a cross section schematically representing a typical Printed Circuit Board (PCB) stack of the prior art.

Aspects of the present disclosure relate to system and methods for improving transmission of high frequency signals in printed circuit boards (PCBs). In particular, the disclosure relates to improving transmission lines such as stripline transmission lines in PCB stacks by reducing the surface roughness of the conducting layers of the PCB.

Transmission line loss per unit length has been shown to be improved by around twenty percent by reducing the roughness of the conducting layers. Method described herein use the copper laminated PCB cores to provide smooth unabraded signal lines and ground paths to improve transmission.

In various embodiments of the disclosure, one or more tasks as described herein may be performed by a data processor, such as a computing platform or distributed computing system for executing a plurality of instructions. Optionally, the data processor includes or accesses a volatile memory for storing instructions, data or the like. Additionally, or alternatively, the data processor may access a non-volatile storage, for example, a magnetic hard-disk, flash-drive, removable media or the like, for storing instructions and/or data.

It is particularly noted that the systems and methods of the disclosure herein may not be limited in its application to the details of construction and the arrangement of the components or methods set forth in the description or illustrated in the drawings and examples. The systems and methods of the disclosure may be capable of other embodiments, or of being practiced and carried out in various ways and technologies.

Alternative methods and materials similar or equivalent to those described herein may be used in the practice or testing of embodiments of the disclosure. Nevertheless, particular methods and materials are described herein for illustrative purposes only. The materials, methods, and examples are not intended to be necessarily limiting.

Figure 2A:
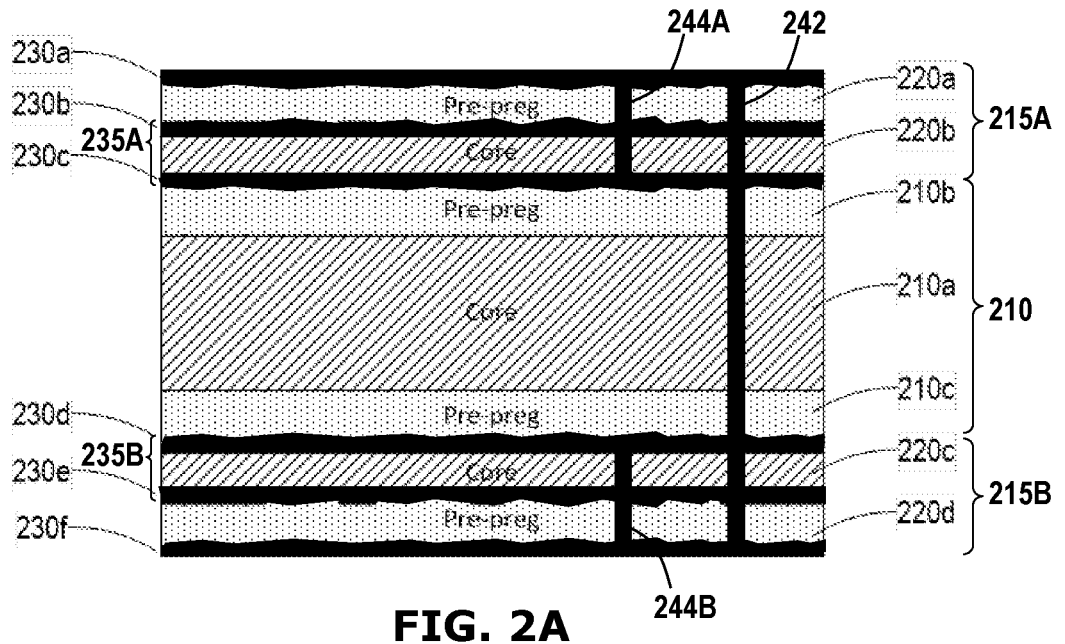
FIG. 2A schematically represents a cross-section through an improved PCB stack for use with high frequency circuits according to an embodiment of the current invention.

Reference is now made to FIG. 2A which schematically illustrates a cross-section through an improved printed circuit board (PCB) stack of the current invention. The improved PCB improves efficiency of high frequency signal transmission by reducing the surface roughness of the conducting layers, thereby reducing the signal path length for small skin depths.

The PCB stack of the embodiment includes two signal transmission stacks 215A, 215B flanking a central dielectric layer 210.

Each signal transmission stacks 215A, 215B includes a central signal carrying layer 230b, 230e, an inner ground plane 230c, 230d separated from the central signal carrying layer 230b, 230e by a first dielectric layer 220b, 220c, and an outer ground plane 230a, 230f, separated from the central signal carrying layer 230b, 230e by a second dielectric layer 220a, 220d.

It is a particular feature of the improved PCB stack up that the inner ground plane 230c, the first dielectric layer 220b, and the signal carrying layer 230b of the upper signal transmission stack 215A are formed from an upper PCB core layer 235A. Accordingly, the first dielectric layer 220b comprises a rigid base material of the PCB core 235A, the signal carrying layer 230b comprises a first copper laminate surface of the PCB core 235A, and the inner ground plane 230c comprises a second copper laminate surface of the PCB core 235A. The second dielectric layer 220a of the upper signal transmission stack 215A comprises an outer prepreg insulator layer, and the outer signal ground plane of the upper signal transmission stack 215A comprises a copper foil 230a which is adhered thereto.

Similarly, the inner ground plane 230d, the first dielectric layer 220c, and the signal carrying layer 230e of the upper signal transmission stack are formed from a lower PCB core layer 235B. Accordingly, the first dielectric layer 220c comprises a rigid base material of the PCB core 235B, the signal carrying layer 230b comprises a first copper laminate surface of the PCB core 235B, and the inner ground plane 230c comprises a second copper laminate surface of the PCB core 235B. The second dielectric layer 220d of the lower signal transmission stack 215B comprises an outer prepreg insulator layer, and the second signal ground plane of the lower signal transmission stack 215B comprises a copper foil 230f which is adhered thereto.

It is noted that, because the signal carrying layers 230b, 230e and the first ground plane layers 230c, 230d are formed from a common PCB core 235A, 235B the facing surfaces of the signal carrying layers 230b, 230e and the first ground plane layers 230c, 230d are the smooth and unabraded internal surfaces of the PCB cores 235A, 235B. For example, a low-roughness copper may be used, having less than one micrometer root mean squared roughness, which stays smooth on the side that it is attached to the core throughout the PCB manufacturing process.

Accordingly, the signal path along the facing surfaces of the signal carrying layers 230b, 230e and the first ground plane layers 230c, 230d is greatly reduced thereby reducing losses during transmission and increasing reliability.

It will be appreciated that various types of vias may be used to connect conducting layers as required, for example a through via structure 242 may connect the outer ground planes 230a, 230f to each other. Further via structures 242A, 242B may be provided to connect the inner ground planes 230c, 230d to their corresponding outer ground planes 230a, 230f.

It is a further feature of embodiments of the current invention that the two signal transmission stacks 215A, 215B may be rigidly connected via a dielectric layer 210 of sufficient thickness to isolate the signals, say 23 millimeters or so. However, it was surprisingly found that a prepreg layer of such thickness was impractical. Under heat, during the stacking process, the thick prepreg layer is not rigid enough to resist shear forces causing the upper transmission stack 215A to slip laterally relative to the lower transmission stack 215B resulting in poor registration between the layers.

Accordingly it is a feature of further embodiments of the current invention that the central dielectric layer 210 includes a rigid central core base layer 210a an upper prepreg layer 210b and a lower prepreg layer 210c.

The rigid central core base layer 210a may be PCB core layer from which all the copper laminate has been removed leaving only the dielectric core material. A PCB core may be selected of a thickness to suit requirements. For example, a rigid central core base layer 210a of thickness 17 millimeters may be adhered to the flanking PCB core layer 235A, 235B via two inner prepreg layers 210b, 210c each of a standard thickness around three millimeters such that the central dielectric layer 210 has a total thickness of 23 millimeters as required.

Figure 2B:
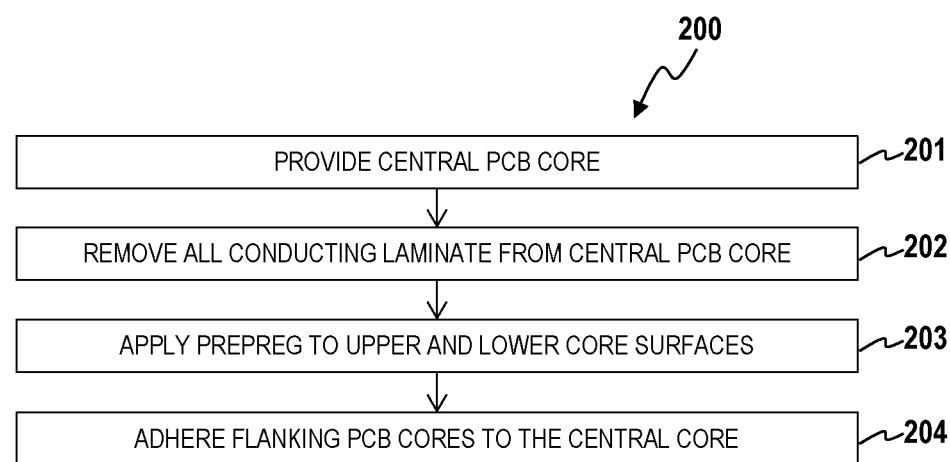
FIG. 2B is a flowchart indicating possible actions for preparing an improved high frequency circuit PCB stack according to another embodiment of the current invention.

Reference is now made to the flowchart of FIG. 2B which indicates possible actions for preparing the inner structure for a double-sided high frequency circuit PCB stack according to another embodiment of the current invention. The method includes providing a central PCB core 201, such as PCB core laminated on both surfaces by a conducting material such as copper; removing all conducting laminate from the surfaces of the PCB core 202, thereby providing a central core comprising only the rigid base dielectric material; applying an upper prepreg layer to the upper surface of the central core and a lower prepreg layer to the lower surface of the central core 203; and adhering an upper flanking PCB core to the upper prepreg layer and a lower flanking PCB core to the lower prepreg layer 204. Further outer layers may be adhered to the inner structure as required. Alternatively, steps 201 and 202 may be united into providing a central PCB core which is void of conducting material lamination a-priori.

Figure 3:
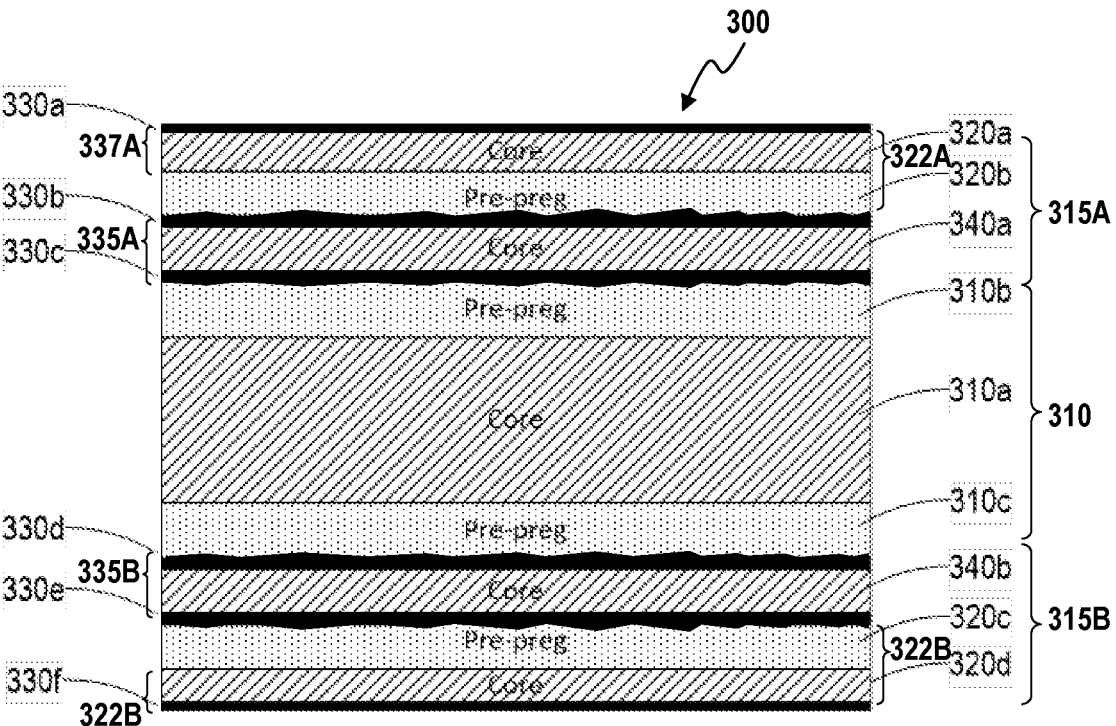
FIG. 3 schematically represents a cross-section through an alternative improved PCB stack for use with high frequency circuits according to another embodiment of the current invention.

Reference is now made to FIG. 3 which schematically represents a cross-section through an alternative high frequency PCB stack 300 according to another embodiment of the current invention.

The alternative PCB stack 300 of the embodiment includes two signal transmission stacks 315A, 315B flanking a central dielectric layer 310. Each signal transmission stacks 315A, 315B includes a central signal carrying layer 330b, 330e, an inner ground plane 330c, 330d separated from the central signal carrying layer 330b, 330e by a first dielectric layer 340a, 340b, and an outer ground plane 330a, 330f, separated from the central signal carrying layer 330b, 330e by a second dielectric layer 322, 324.

As in the previous embodiment described above in relation to FIG. 2A, the inner ground plane 330c, the first dielectric layer 340a, 340b and the signal carrying layer 330b, 330e of the signal transmission stacks 315A, 315B are again formed from an PCB core layers 335A, 335B such that the first dielectric layer 340a, 340b comprise the rigid base dielectric material of the PCB cores 335A, 335B, the signal carrying layers 330b, 330e comprise the outer copper laminate surface of the PCB cores 335A, 335B, and the inner ground planes 330c, 330d comprise the inner copper laminate surfaces of the PCB cores 335A, 335B.

Furthermore, the alternative PCB stack 300 of the current embodiment is further characterized by the use of outer PCB cores 337A, 337B to provide the conducting layers for the outer ground planes 330a, 330f. The outer PCB cores 337A, 337B may be prepared by removing the copper laminate from the inner surface of the core before adhering the core 320A, 320D to the signal carrying layers 330b, 330e with adhesive prepreg layers 320b, 320c such that the second dielectric layers 322A, 322B comprise the cores 320a, 320d and the adhesive prepreg insulator layers 320b, 320c. Accordingly, the inner surface of the outer ground planes are the smooth interface surface of the core reducing still further the resistance of the signal stripline.

Figure 4:
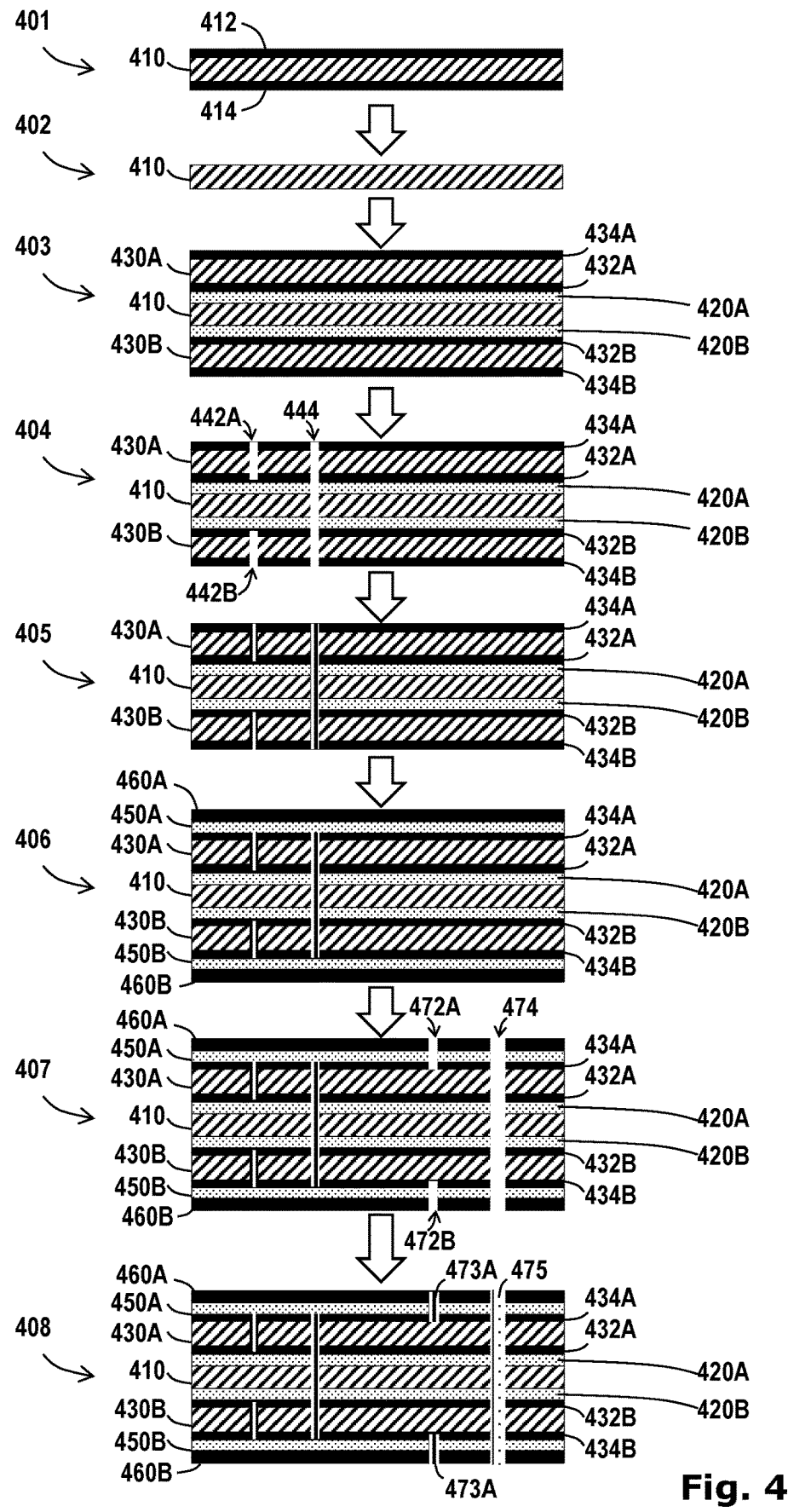
FIG. 4 indicates cross-sections of an example of an improved high frequency circuit PCB stack during various possible stages of its manufacture.
Figure 5:
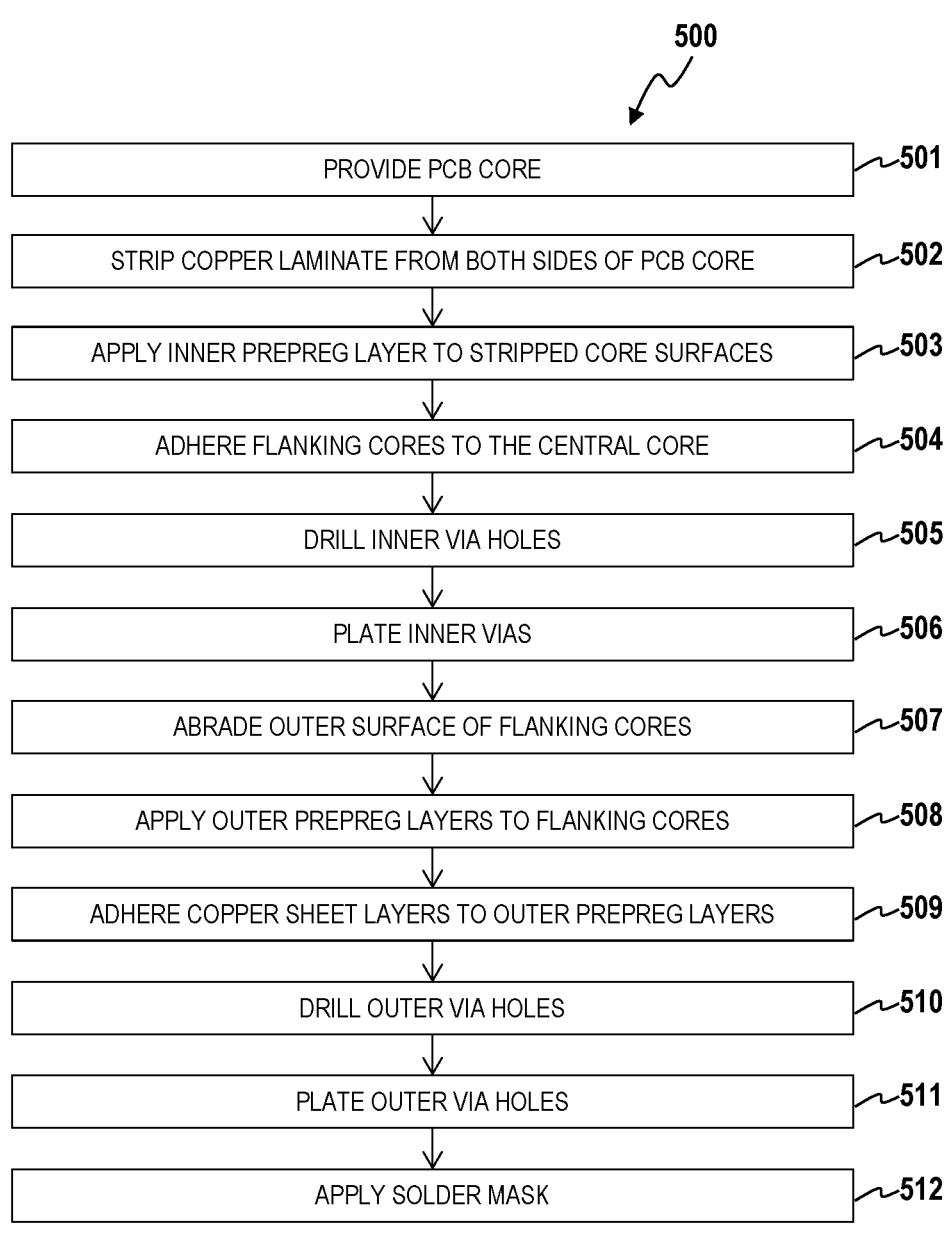
FIG. 5 is a flowchart indicating possible actions for preparing an example of an improved high frequency circuit PCB stack.

Reference is now made to FIG. 4, which schematically illustrates cross-sections of various stages during the production of an embodiment of the high frequency circuit PCB stack, and the flowchart of FIG. 5 which presents possible actions for manufacturing improved high frequency circuit PCB stacks.

The method of manufacture 500 includes providing a PCB core 401 comprising a rigid base material 410 laminated by an upper conducting surface 412 and a lower conducting surface 414 such as a copper laminated core.

All conducting laminate is stripped 502 from the first PCB core 401 providing a central core 402 comprising only the rigid base dielectric material 410. Inner prepreg layers 420A, 420B are applied 503 to the upper and lower surfaces of the central core 410 and the inner conducting surfaces 432A, 432B of flanking PCB cores 430A, 430B are adhered thereto 504 producing an inner structure 403.

Internal vias 442A, 442B, 444 may be prepared by drilling holes 505 into the inner structure 404 and plating 506 the inner walls of the drilled holes 405. It should be noted that the term "drilling" encompasses any hole-producing technology, such as through-hole mechanical drilling, controlled-depth mechanical drilling, or laser drilling that is commonly used to drill through a single layer of dielectric sheet.

For example, vias 442A, 442B may be prepared through the flanking PCB cores conductively connecting the outer conducting surfaces 434A, 434B to the inner conducting surfaces 432A, 432B and a bridging via 444 may be prepared conductively connecting the outer conducting surfaces 434A, 434B of the to each other.

The outer conducting surfaces 434A, 434B of the flanking cores may be roughened by abrading 507 and outer prepreg layers 450A, 450B may be applied 508 to the flanking PCB cores 430A, 430B. Copper sheets 460A, 460B may be adhered 509 to the outer prepreg layers 450A, 450B thereby producing the stack 406. Optionally, the inner surface of the copper sheet may be abraded before abutting the abraded surface to the prepreg layer before pressing the copper sheet to the prepreg layer for improved adherence.

Outer via holes 472A, 472B, 474 may be drilled 510 into the stack 406 and plated 511, as required. For example vias 473A may be prepared through the outer conducting layers 460A, 460B and the outer prepreg layer conductively connecting the outer conducting layers 460A, 460B to the outer conducting surfaces 434A, 434B of the flanking PCB cores. Similarly through vias 475 may be prepared conductively connecting the outer conducting layers 460A, 460B to each other. It is noted that, where the through hole has a large diameter, a resin filling may be used to fill the hole after plating. A solder mask may be applied to the whole stack 512.

Technical and scientific terms used herein should have the same meaning as commonly understood by one of ordinary skill in the art to which the disclosure pertains. Nevertheless, it is expected that during the life of a patent maturing from this application many relevant systems and methods will be developed. Accordingly, the scope of the terms such as computing unit, network, display, memory, server and the like are intended to include all such new technologies a priori.

As used herein the term "about" refers to at least ±10%.

The terms "comprises", "comprising", "includes", "including", "having" and their conjugates mean "including but not limited to" and indicate that the components listed are included, but not generally to the exclusion of other components. Such terms encompass the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" may include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween. It should be understood, therefore, that the description in range format is merely for convenience and brevity and should not be construed as an inflexible limitation on the scope of the disclosure. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6 as well as non-integral intermediate values. This applies regardless of the breadth of the range.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. Certain features described in the context of various embodiments are not to be considered essential features of those embodiments unless the embodiment is inoperative without those elements.

Although the disclosure has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present disclosure. To the extent that section headings are used, they should not be construed as necessarily limiting.

The scope of the disclosed subject matter is defined by the appended claims and includes both combinations and sub combinations of the various features described hereinabove as well as variations and modifications thereof, which would occur to persons skilled in the art upon reading the foregoing description.

The invention claimed is:

1. A method for manufacturing a printed circuit board (PCB) comprising:

providing a first PCB core comprising a central core comprising a rigid base material void of conductor lamination;

adhering an upper inner prepreg layer to an upper side surface of the central core and a lower inner prepreg layer to a lower surface of the central core;

providing an upper flanking PCB core and a lower flanking PCB core;

adhering the upper flanking PCB core to the upper inner prepreg layer and the lower flanking PCB core to the lower inner prepreg layer;

adhering an upper outer prepreg layer to the upper flanking PCB core and a lower outer prepreg layer to the lower flanking PCB core;

adhering an upper outer conducting layer to the upper outer prepreg layer and a lower outer conducting layer to the lower outer prepreg layer; and applying a solder mask, wherein the step of providing the central core void of conductor lamination comprises:

providing a first PCB core comprising a conductor laminated rigid base material, and removing all conducting laminate from the first PCB core leaving only a substrate of rigid base dielectric material.

2. The method of claim 1 wherein each outer conducting layer comprises a copper sheet layer, and the step of adhering each outer conducting layer to an outer prepreg layer comprises:

providing the copper sheet layer;

abrading an inner surface of the copper sheet layer;

abutting an abraded surface of the copper sheet layer to the outer prepreg layer; and pressing the copper sheet layer to the outer prepreg layer.

3. The method of claim 1 wherein each step of adhering an outer conducting layer to an outer prepreg layer comprises:

abrading at least one surface of the conducting layer;

abutting an abraded surface of the conducting layer to the prepreg layer; and pressing the conducting layer to the prepreg layer.

4. The method of claim 1 further comprising preparing at least one via by:

drilling a hole through at least one layer; and conductively plating the inner surface of the hole.

5. The method of claim 1 further comprising:

preparing a via through the upper flanking PCB core conductively connecting the outer conducting surface of the upper flanking PCB core to the inner conducting surface of the upper flanking PCB core;

preparing a via through the lower flanking PCB core conductively connecting the outer conducting surface of the lower flanking PCB core to the inner conducting surface of the lower flanking PCB core; and preparing a bridging via conductively connecting the outer conducting surface of the upper flanking PCB core to the inner conducting surface of the lower flanking PCB core.

6. The method of claim 1 further comprising:

preparing a via through the upper outer conducting layer and the upper outer prepreg layer conductively connecting the upper outer conducting layer to the outer conducting surface of the upper flanking PCB core;

preparing a via through the lower outer conducting layer and the lower outer prepreg layer conductively connecting the lower outer conducting layer to the outer conducting surface of the lower flanking PCB core; and preparing a through via conductively connecting the upper outer conducting layer to the lower outer conducting layer.

7. The method of claim 6 wherein the step of preparing the through via conductively connecting the upper outer conducting layer to the lower outer conducting layer comprises:

drilling a through hole from the upper outer conducting layer to the lower outer conducting layer;

conductively plating the inner surface of the through hole; and filling the through hole with resin.

8. A method for manufacturing a printed circuit board (PCB), comprising:

providing a first PCB core comprising a central core comprising a rigid base material void of conductor lamination;

adhering an upper inner prepreg layer to an upper side surface of the central core and a lower inner prepreg layer to a lower surface of the central core;

providing an upper flanking PCB core and a lower flanking PCB core;

adhering the upper flanking PCB core to the upper inner prepreg layer and the lower flanking PCB core to the lower inner prepreg layer;

adhering an upper outer prepreg layer to the upper flanking PCB core and a lower outer prepreg layer to the lower flanking PCB core;

adhering an upper outer conducting layer to the upper outer prepreg layer and a lower outer conducting layer to the lower outer prepreg layer; and applying a solder mask, wherein each outer conducting layer comprises an outer PCB core layer, and the step of adhering each outer conducting layer to an outer prepreg layer comprises:

providing the outer PCB core layer comprising a rigid base material laminated by an outer conducting surface and an inner conducting surface, removing all conducting material from the inner conducting surface of the outer PCB core thereby creating an inner dielectric surface, abutting the inner dielectric surface to the outer prepreg layer, and pressing the outer PCB core layer to the outer prepreg layer.

* * * * *